United States Patent
Hsu et al.

(10) Patent No.: US 6,998,891 B2
(45) Date of Patent: *Feb. 14, 2006

(54) APPARATUS FOR CALIBRATING A CHARGE PUMP AND METHOD THEREFOR

(75) Inventors: Tse-Hsiang Hsu, Taipei (TW); Chih-Cheng Chen, Taipei (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 11/010,420

(22) Filed: Dec. 14, 2004

(65) Prior Publication Data

US 2005/0099215 A1 May 12, 2005

Related U.S. Application Data

(63) Continuation of application No. 10/253,650, filed on Sep. 25, 2002, now Pat. No. 6,850,102.

(30) Foreign Application Priority Data

Oct. 24, 2001 (TW) .............................. 90126330 A

(51) Int. Cl.
*H03L 7/06* (2006.01)
(52) U.S. Cl. .................................................... 327/157
(58) Field of Classification Search ................ 327/148, 327/157
See application file for complete search history.

(56) References Cited

U.S. PATENT DOCUMENTS

| 3,944,936 A | 3/1976 | Pryor ............................ 327/79 |
| 4,491,799 A | 1/1985 | Giardinelli ..................... 327/2 |
| 5,334,953 A | 8/1994 | Mijuskovic .................... 331/8 |
| 5,508,660 A | 4/1996 | Gersbach et al. ............. 331/17 |
| 6,229,362 B1 | 5/2001 | Choi ............................ 327/157 |
| 2002/0176188 A1 | 11/2002 | Ruegg et al. ................. 360/46 |

*Primary Examiner*—Quan Tra
(74) *Attorney, Agent, or Firm*—Birch, Stewart, Kolasch & Birch, LLP

(57) ABSTRACT

A signal calibration apparatus of a charge pump minimizes a current from the charge pump. The signal calibration apparatus includes a detecting circuit, a current adjusting circuit, and a calibrating circuit, wherein the detecting circuit is coupled to the charge pump for outputting a detecting signal according to the direction and magnitude of the current, the current adjusting circuit is coupled to the detecting circuit for outputting a calibrating signal according to the polarity and magnitude of the slew rate of the detecting signal; and the calibrating circuit, which consists of a first calibration current source and a second calibration current source, is respectively coupled to the charge pump and the current adjusting circuit for adjusting the first current and the second current by outputting a first calibrating current and second calibrating current to the charge pump.

11 Claims, 4 Drawing Sheets

300

APPARATUS FOR CALIBRATING A CHARGE PUMP AND METHOD THEREFOR

This application is a Continuation of application Ser. No. 10/253,650, filed on Sep. 25, 2002 now U.S. Pat. No. 6,850,102, and for which priority is claimed under 35 U.S.C. § 120; and this application claims priority of Application No. 090126330 filed in Taiwan, R.O.C. on Oct. 24, 2001 under 35 U.S.C. § 119; the entire contents of all are hereby incorporated by reference.

BACKGROUND OF THE INVENTION

1. Field of the Invention

The invention relates in general to a signal calibration apparatus, and more particularly to a signal calibration apparatus for use in a charge pump.

2. Description of the Related Art

Phase locked loop (PLL) is a circuit for controlling the frequency and the phase of its output signal according to a criterion. Nowadays, the achievement of a high-speed, low-noise PLL is the major subject to be devoted to.

FIG. 1 illustrates the block diagram of a PLL 100 according to a traditional method. The PLL 100 includes a phase/frequency detector (PFD) 102, a loop filter (LP) 104, a voltage controlled oscillator (VCO) 106, and a frequency divider (FD) The PFD 102 receives an input frequency $f_{IF}$ and a reference frequency $f_{ref}$, and then outputs a signal S1 to the LP 104 according to the phase difference between the input frequency $f_{IF}$ and the reference frequency $f_{ref}$. The LP 104 filters out the noise and then outputs a signal S2 to the VCO 106. The VCO 106 outputs an output frequency $f_{OF}$, which is also the output signal of the PLL 100 and is fed back to the FD 108. The FD 108 outputs the reference frequency $f_{ref}$, which is equal to the output frequency $f_{OF}$ divided by a positive integer N, wherein the positive integer N is determined by a control signal $f_{CO}$.

After a settle time from the starting of the PLL 100, the PLL 100 goes to a lock state, wherein the reference frequency $f_{ref}$ is equal to the input frequency $f_{IF}$, and the output frequency $f_{OF}$ is equal to the positive multiple of the input frequency $f_{IF}$.

FIG. 2 shows a charge pump 200, which is the post-stage of the PFD 102. The charge pump 200 has a current source $I_{UP}$ and a current source $I_{DN}$ for respectively receiving a rising signal $f_{up}$ and a descending signal $f_{dn}$ from the pre-stage, wherein the rising signal $f_{up}$ and the descending signal $f_{dn}$ are determined according to the phase difference between the reference frequency $f_{ref}$ and the input frequency $f_{IF}$. The current source $I_{UP}$ outputs current $i_{up}$ according to the rising signal $f_{up}$ while the current source $I_{DN}$ outputs current $i_{dn}$ according to the descending signal $f_{dn}$. Hence, the current $i_{up}$ and current $i_{dn}$ relate to the phase difference between the reference frequency $f_{ref}$ and the input frequency $f_{IF}$. The charge pump 200 outputs a current Io, which is the difference between the current $i_{up}$ and current $i_{dn}$ and is proportional to the phase difference between the reference frequency $f_{ref}$ and the input frequency $f_{IF}$.

Ideally, the characteristics of the current sources $I_{UP}$ and $I_{DN}$ are identical. When they receive the same signals, the current $i_{up}$ outputted from the power source $I_{UP}$ is equal to the current $i_{dn}$ outputted from the current source $I_{DN}$, and thus the current $I_o$ is zero. However, circuit elements of the same kind such as the two current sources, in reality, have slight variations in physical characteristic. Thus, the current $i_{up}$ outputted from the current source $I_{UP}$ will not be equal to the current $i_{dn}$ outputted from the current source $I_{DN}$ when the current source $I_{UP}$ and the current source $I_{DN}$ respectively receive the rising signal $f_{up}$ and the descending signal $f_{dn}$ in the same magnitude. In this case, the output current $I_O$ will not be zero even if the reference frequency $f_{ref}$ and the input frequency $f_{IF}$ are in phase, thus degrading the performance of the PLL in phase-locking. Therefore, it is desirable to have a charge pump with higher precision to overcome these limitations to the PLL.

SUMMARY OF THE INVENTION

It is therefore an object of the invention to provide a signal calibration apparatus for use in a charge pump so as to improve the performance of the PLL. The current outputted from the charge pump is calibrated by compensating for the difference between two current sources.

In accordance with the object of the invention, a signal calibration apparatus of the charge pump is disclosed. The charge pump includes a first switch, a second switch, a first current source, and a second current source, wherein the first current source is coupled to the first switch at a first node and the second current source is coupled to the second switch at a second node, and the first switch is coupled to the second switch at a third node. The charge pump outputs a current through the third node, and the direction and magnitude of the current are determined by a first current and a second current, wherein the first current is outputted from the first current source and passes through the first switch and the second current is outputted from the second current source and passes through the second switch.

The signal calibration apparatus includes a detecting circuit, a current adjusting circuit, and a calibrating circuit, wherein the detecting circuit is coupled to the charge pump at the third node for outputting a detecting signal according to the direction and magnitude of the current, the current adjusting circuit is coupled to the detecting circuit for outputting a calibrating signal according to the polarity and magnitude of the slew rate for the detecting signal; and the calibrating circuit is respectively coupled to the charge pump and the current adjusting circuit for adjusting the first current and the second current by outputting a first calibrating current and a second calibrating current to the charge pump.

BRIEF DESCRIPTION OF THE DRAWINGS

Other objects, features, and advantages of the invention will become apparent from the following detailed description of the preferred but non-limiting embodiments. The description is made with reference to the accompanying drawings.

DESCRIPTION OF THE PREFERRED EMBODIMENT

The principle of the invention is to provide the two current sources of a charge pump with respective calibration current sources. In addition, the output current produced from the charge pump is minimized by adjusting the magnitude of the calibrating currents outputted from the calibration current sources. In this way, reduction in the output signal's errors resulted from the characteristic variations of the two current sources of the charge pump can be achieved, which improves the performance of a PLL using the charge pump in phase locking.

Figure 1:
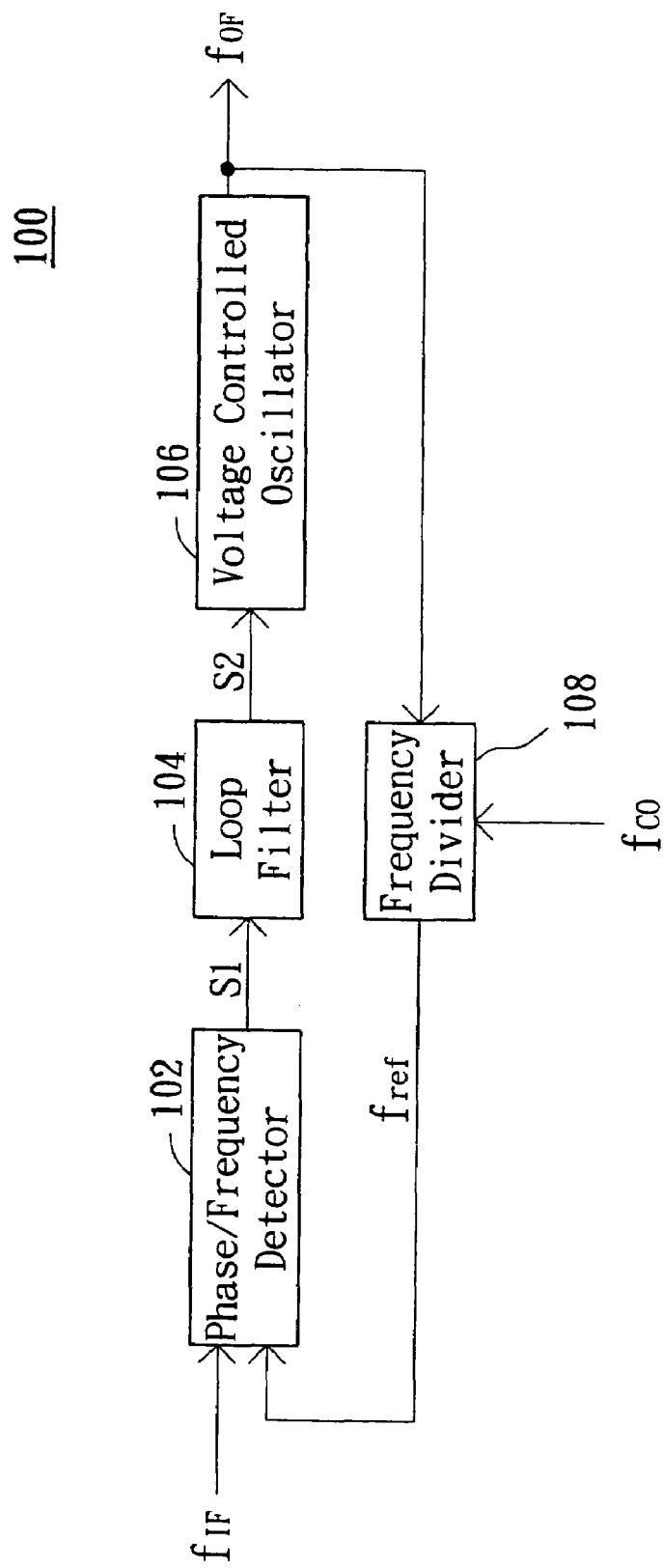
FIG. 1 shows the block diagram of a PLL (phase lock loop) according to a traditional method.
Figure 2:
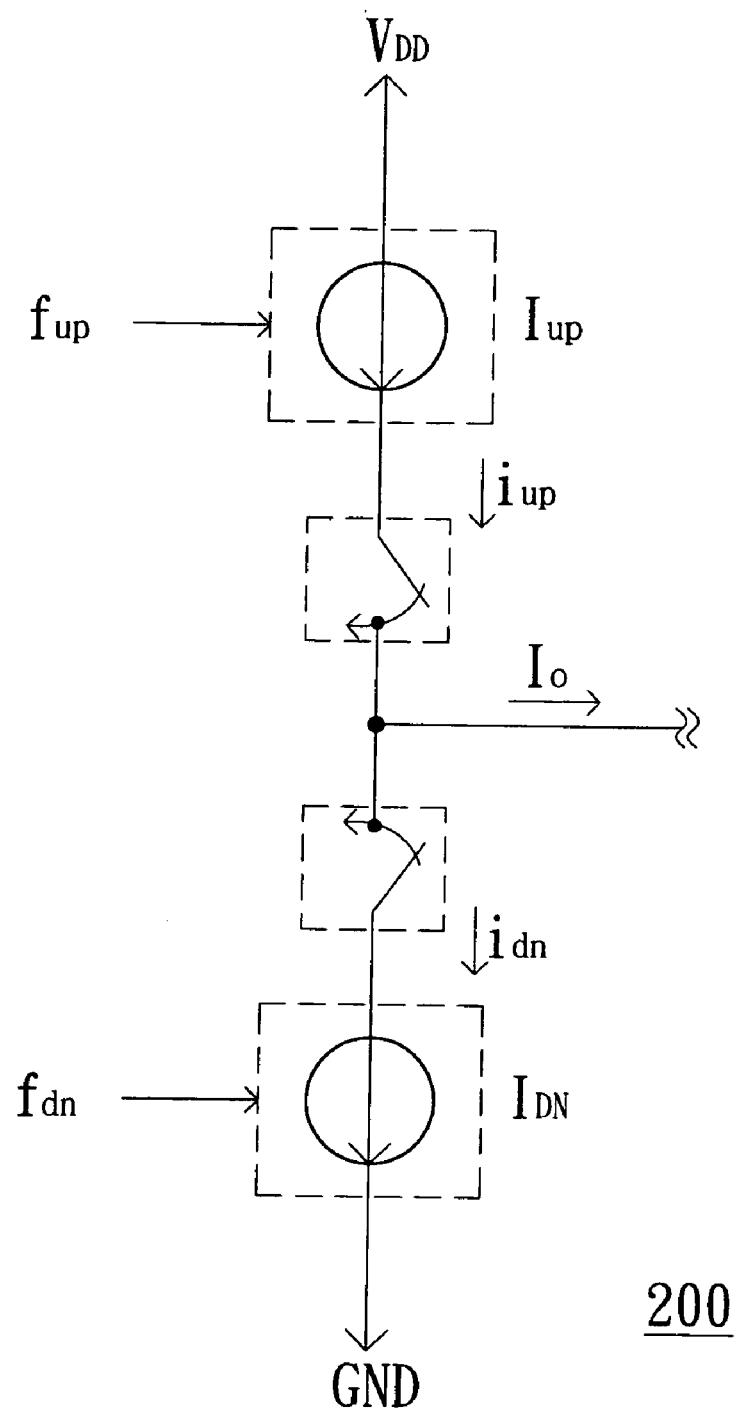
FIG. 2 shows a charge pump.
Figure 3:
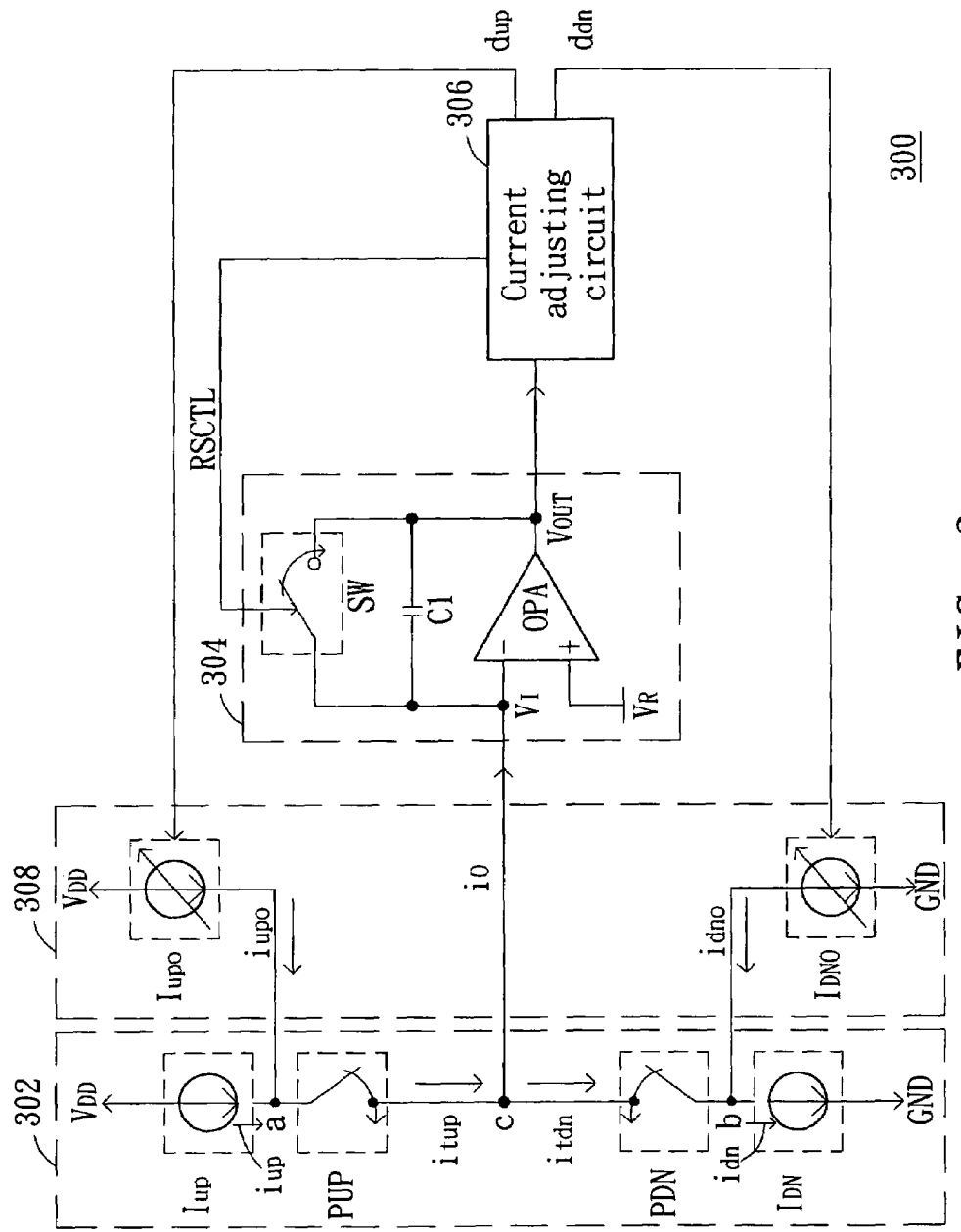
FIG. 3 shows the circuit of the calibration apparatus for the charge pump according to the present invention.

FIG. 3 illustrates the circuit of the signal calibration apparatus for the charge pump according to the method of the present invention. The calibration apparatus 300 has a charge pump 302, a detecting circuit 304, a current adjusting circuit 306, and a calibrating circuit 308, wherein the detecting circuit 304 is coupled to charge pump 302 at node c. The charge pump 302 includes a current source $I_{UP}$, a current source $I_{DN}$, a switch PUP, and a switch PDN. The current sources $I_{UP}$ and $I_{DN}$ are respectively coupled to the switches PUP and PDN at node a and node b, and the switch PUP is coupled to the switch PDN at node c.

As shown in FIG. 3, the detecting circuit 304 includes an integrator, composed of an operational amplifier OPA and a capacitor C1, and a switch SW in parallel connection with the operational amplifier OPA and the capacitor C1. The detecting circuit 304 outputs a detecting signal Vout according to the current $i_o$ outputted from the charge pump 302 through node c.

The current adjusting circuit 306 is coupled to the operational amplifier OPA and switch SW, and outputs calibrating signals $d_{up}$ and $d_{dn}$ according to the detecting signal Vout from the operational amplifier OPA. The current adjusting circuit 306 also outputs a control signal RSCTL for controlling the switch SW so as to control the detecting circuit 304.

The calibrating circuit 308 has a calibration current source $I_{UPO}$ and a calibration current source $I_{DNO}$, wherein the calibration current sources $I_{UPO}$ and $I_{DNO}$ are respectively coupled to the charge pump 302 at node a and node b, and are respectively coupled to the current adjusting circuit 306. The calibrating circuit 308 outputs a calibrating current $i_{upo}$ and a calibrating current $i_{dno}$ into the charge pump 302 according to the calibrating signal $d_{up}$ and the calibrating signal $d_{dn}$, respectively.

Figure 4:
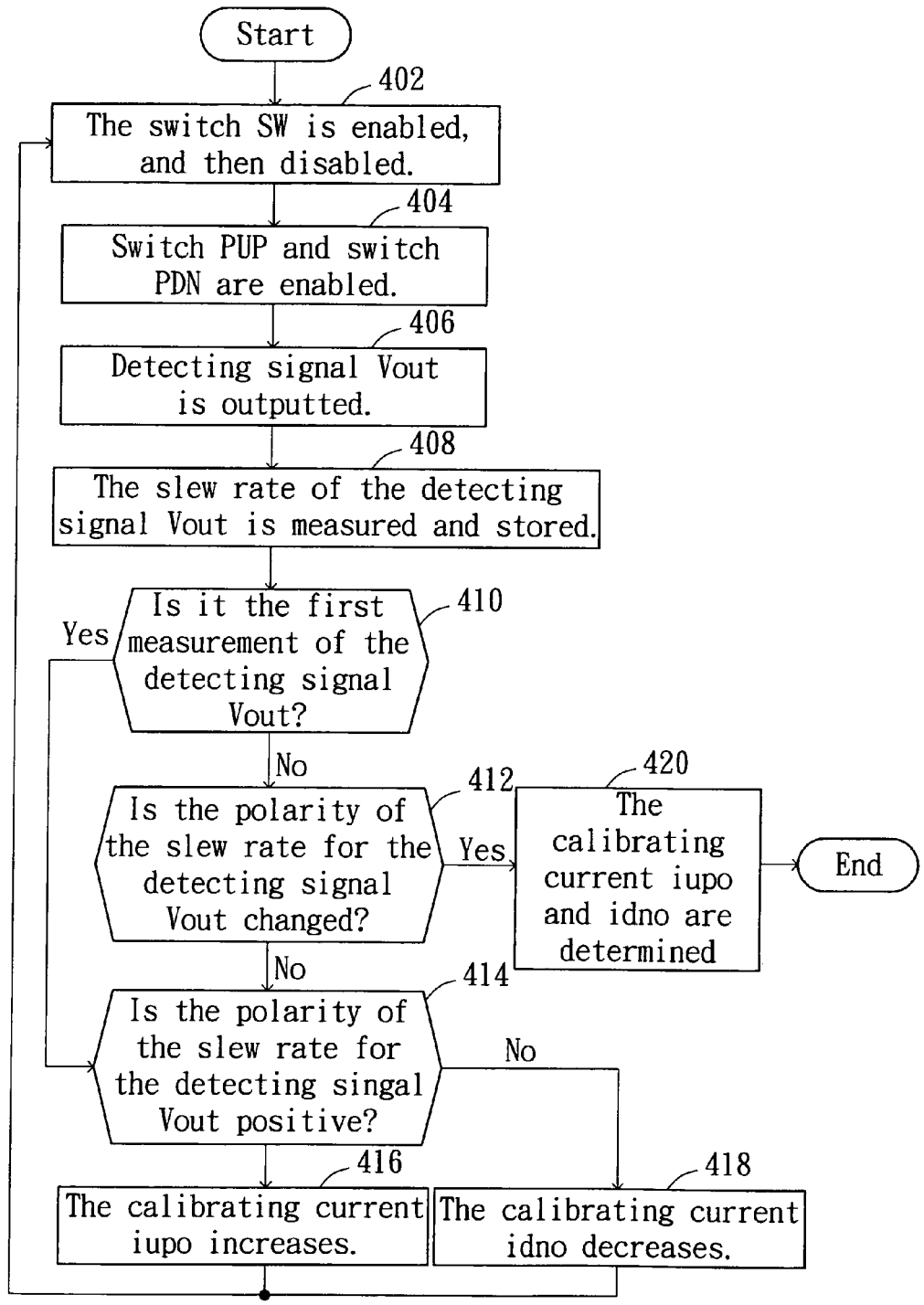
FIG. 4 shows the flow chart of the calibration method for the charge pump according to the present invention.

FIG. 4 illustrates the flow chart of the calibration method for the charge pump according to the method of the present invention. First, the capacitor C1 and the operational amplifier OPA are reset in step 402 by closing and then opening the switch SW. The voltage across the capacitor C1 and the output voltage of the operational amplifier OPA are reset to zero when the switched SW is closed. After that, the switch SW is opened again.

Next, in step 404, the switch PUP and switch PDN are closed. At the same time, current source $I_{UP}$ and current source $I_{DN}$ respectively output current $i_{up}$ and current $i_{dn}$, and the charge pump 302 outputs the current $i_o$ through node c, wherein $i_{tup}$ and $i_{tdn}$ indicated in FIG. 3 are identical to $i_{up}$ and $i_{dn}$ respectively. Ideally, the current $i_{up}$ produced by the current source $I_{UP}$ is equal to the current $i_{dn}$ outputted from the current source $I_{DN}$, and the current $i_{up}$ passes through the switch PUP, switch PDN, and flows out through current source $I_{DN}$. Thus, the current $i_o$ is zero. However, the current $i_o$ is not zero in reality because every circuit device has inevitable variations in characteristic which may cause the currents $i_{up}$ and $i_{dn}$ to be different. As the current $i_{up}$ is larger than the current $i_{dn}$, the current $i_o$ flows out of the charge pump 302; as the current $i_{up}$ is smaller than the current $i_{dn}$, the current $i_o$ flows into the charge pump 302, wherein the current $i_o$ is the difference between the current $i_{up}$ and the current $i_{dn}$.

Afterwards, in step 406, the detecting signal Vout is outputted from the operational amplifier OPA. The current $i_o$ from the charge pump 302 produces an input voltage $V_I$ at the negative input terminal of the operational amplifier OPA. A reference voltage $V_R$, being a constant value, is applied to the positive input terminal of the operational amplifier OPA. The operational amplifier OPA outputs a detecting signal Vout according to the reference voltage $V_R$ and the input voltage $V_I$, wherein the detecting signal Vout is proportional to the difference between the reference voltage $V_R$ and the input voltage $V_I$.

The capacitor C1 is charged as the current $i_o$ is inputted into the detecting circuit 304. Accordingly, the voltage $V_I$ inputted into the negative input terminal of the operational amplifier OPA increases with time and the detecting signal Vout decreases with time. As the current $i_o$ becomes larger, the capacitor C1 is charged at higher speed and the voltage $V_I$ increases at higher speed as well. Therefore, the detecting signal Vout decreases faster. Conversely, the detecting signal Vout increases with time if the current $i_o$ is inputted into the charge pump 302, and the detecting signal Vout increases faster if the current $i_o$ becomes larger.

Then, in step 408, a slew rate of the detecting signal Vout is measured and stored by the current adjusting circuit 306. The slew rate is defined as the change of the signal value per unit time. As the signal increases with time, the polarity of the slew rate is positive; as the signal decreases with time, the polarity of the slew rate is negative. In addition, the polarity of slew rate of the detecting signal Vout is negative when the current $i_o$ is outputted from the charge pump 302. The larger the value of the slew rate, the larger of the current $i_o$. Therefore, the offset between the current $i_{up}$ and current $i_{dn}$ can be determined according to the slew rate of the detecting signal Vout.

The current adjusting circuit 306 can include, for example, an analog-to-digital converter (ADC) so as to measure and store the slew rate of the detecting signal Vout in digital form. In another example, a comparator can be employed to make the positive and negative polarity of the slew rate respectively being represented by a logic high signal and a logic low signal. The former will be described in the following.

In step 410, a determination as to whether it is the first time to measure the detecting signal Vout is made. If so, step 414 is processed, wherein the current adjusting circuit 306 outputs the calibrating signal $d_{up}$ or the calibrating signal $d_{dn}$ according to the polarity of the slew rate of the detecting signal Vout. If the slew rate is positive, the current adjusting circuit 306 outputs the calibrating signal $d_{up}$ to the calibration current source $I_{UPO}$, as indicated in step 416, wherein the current $i_o$ outputted from the detecting circuit 304 is inputted into the charge pump 302 and the calibration current source $I_{UPO}$ outputs the calibrating current $i_{upo}$ according to the calibrating signal $d_{up}$. If the slew rate is negative, the current adjusting circuit 306 outputs the calibrating signal $d_{dn}$ to the calibration current source $I_{DNO}$, as in step 418, wherein the current $i_o$ outputted from the charge pump 302 is inputted into the detecting circuit 304 and the calibration current source $I_{DNO}$ outputs the calibrating current $i_{dno}$ according to the calibrating signal $d_{dn}$.

Please note that the calibrating currents $i_{upo}$ and $i_{dno}$ are much smaller than the currents $i_{up}$ and $i_{dn}$. In addition, the direction and the magnitude of the current $i_o$ not only relate to the currents $i_{up}$ and $i_{dn}$, but also to the calibrating currents $i_{upo}$ and $i_{dno}$. In the charge pump 302, both the current $i_{up}$ and the calibrating current $i_{upo}$ flow through the switch PUP. Both the current $i_{dn}$ and the calibrating current $i_{dno}$ flow through the switch PDN, too. Therefore, the current difference between the current $i_{up}$ and the current $i_{dn}$ becomes smaller owing to the adjustment of the calibrating current $i_{upo}$ and $i_{dno}$.

After the first calibration cycle, the method is returned to step 402 to reset the capacitor C1 and the operational amplifier OPA and then steps 404 to 408 are repeated. In addition, the detecting circuit 304 outputs detecting signal Vout according to the current $i_o$ from the charge pump 302, and the current adjusting circuit 306 measures and store the slew rate of the detecting signal Vout, wherein the magnitude of the slew rate of the detecting signal Vout is smaller than that during the first calibration cycle because of the current $i_o$ becoming smaller.

Step 414 will be processed if the polarity of the slew rate of the detecting signal Vout is not changed during step 412. Step 416 or step 418 is continued, as described above. If the polarity of the slew rate of the detecting signal Vout is not changed, the calibration cycle will be processed repeatedly. In each calibration cycle, the calibrating currents $i_{upo}$ and $i_{dno}$ have their variations in magnitude much smaller than that of the currents $i_{up}$ and $i_{dn}$, and the current $i_o$ becomes much smaller regardless of the direction of the current $i_o$.

Step 420 will be processed if the polarity of the slew rate of the detecting signal Vout is changed. The corresponding calibrating currents $i_{upo}$ and $i_{dno}$ are determined as the final outputs of the calibration current sources $I_{UPO}$ and current source $I_{DNO}$, respectively. Ideally, the calibration process is finished as the current $i_o$ is zero and the slew rate of the detecting signal Vout is shifted from non-zero to zero. However, the calibration process is also possibly finished by the polarity shifting between positive and negative, and accordingly the direction of the current $i_o$ and the polarity of the detecting signal Vout are reversed.

Therefore, the calibrating current $i_{upo}$ and $i_{dno}$ are determined by the following two methods during the step 420. For the first method, the respective final outputs of the calibration current source $I_{UPO}$ and calibration current source $I_{DNO}$ are determined either by the calibrating current $i_{upo}$ and $i_{dno}$ during the calibration cycle of polarity changing or by those prior to the calibration cycle of polarity changing. For the second method, the respective final outputs of the calibration current source $I_{UPO}$ and $I_{DNO}$ are the calibrating current $i_{upo}$ and $i_{dno}$ having the smaller slew rate of the detecting signal Vout in the last two calibration cycles. The first method uses simpler circuit but the calibrating current $i_{upo}$ and $i_{dno}$ thereof are not always the optimized ones. The second method can provide the optimized calibrating current $i_{upo}$ and calibrating current $i_{dno}$, but uses more complex circuit.

Alternatively, in the example of the comparator, the polarity transition of the slew rate will trigger the toggle of the signal outputted from the comparator. In step 412, when the polarity of the slew rate of the detecting signal is changed, the comparator changes its output from logic high to logic low or from logic low to logic high. Then, the continuing process of determination for the optimized calibrating current $i_{upo}$ and $i_{dno}$ is implemented in step 420 as before.

In the signal calibration apparatus of the present invention, two calibration current sources are provided to two current sources of the charge pump so as to minimizing the current produced by the charge pump. Thus, the performance of PLL is improved because the two calibration current sources compensate the characteristic difference of the two current sources.

While the invention has been described by way of example and in terms of the preferred embodiment, it is to be understood that the invention is not limited to the disclosed embodiment. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A calibration apparatus for minimizing a main current from a charge pump, said charge pump including a first switch, a second switch, a first current source, and a second current source, wherein said first current source is coupled to said first switch at a first node, said second current source is coupled to said second switch at a second node, and said first switch is coupled to said second switch at a third node, said charge pump outputs said main current through said third node when said first switch and said second switch are enabled, the direction and magnitude of said main current are determined by a first current and a second current, wherein said first current is outputted from said first current source and passes through said first switch, and said second current is outputted from said second current source and passes through said second switch, said calibration apparatus comprising:

a detecting circuit coupled to said charge pump at said third node for outputting a detecting signal according to said direction and magnitude of said main current;

a current adjusting circuit coupled to said detecting circuit for outputting a calibrating signal according to the polarity of the slew rate of said detecting signal and for storing a signal corresponding to the slew rate of said detecting signal according to the polarity of the slew rate of said detecting signal, wherein said current adjusting circuit outputs said calibrating signal according to said signal corresponding to the slew rate of said detecting signal; and a calibrating circuit coupled to said charge pump and said current adjusting circuit for adjusting said first current and said second current according to said calibrating signal by outputting a first calibrating current and a second calibrating current to said charge pump;

wherein when the calibration apparatus enters a calibration mode to minimize said main current from said charge pump, both said first switch and said second switch are enabled.

2. A calibration apparatus according to claim 1, wherein said detecting circuit is capable of performing integration.

3. A calibration apparatus according to claim 1, wherein said calibrating circuit comprises a first calibration current source and a second calibration current source, said first calibration current source is coupled to said charge pump at said first node and said second calibration current source is coupled to said charge pump at said second node.

4. A calibration apparatus according to claim 3, wherein said calibrating signal comprises a first calibrating signal and a second calibrating signal, said first calibrating signal is used for adjusting said first calibrating current outputted from said first calibration current source, said second calibrating signal is used for adjusting said second calibrating current outputted from said second calibration current source.

5. A calibration apparatus for minimizing a main current from a charge pump, said charge pump including a first switch, a second switch, a first current source, and a second current source, wherein said first current source is coupled to said first switch at a first node, said second current source is coupled to said second switch at a second node, and said first switch is coupled to said second switch at a third node, said charge pump outputs said main current through said third node when said first switch and said second switch are enabled, the direction and magnitude of said main current are determined by a first current and a second current, wherein said first current is outputted from said first current source and passes through said first switch, and said second current is outputted from said second current source and passes through said second switch, said calibration apparatus comprising:
- a detecting circuit coupled to said charge pump at said third node for outputting a detecting signal according to said direction and magnitude of said main current;
- a current adjusting circuit coupled to said detecting circuit for outputting a calibrating signal according to the polarity of the slew rate of said detecting signal, said current adjusting circuit comprising:
  - an analog-to-digital converter for generating a digital signal according to the polarity of the slew rate of said detecting signal, wherein said current adjusting circuit outputs said calibrating signal according to said digital signal; and
- a calibrating circuit coupled to said charge pump and said current adjusting circuit for adjusting said first current and said second current according to said calibrating signal by outputting a first calibrating current and a second calibrating current to said charge pump.

6. A calibration apparatus for minimizing a main current from a charge pump, said charge pump including a first switch, a second switch, a first current source, and a second current source, wherein said first current source is coupled to said first switch at a first node, said second current source is coupled to said second switch at a second node, and said first switch is coupled to said second switch at a third node, said charge pump outputs said main current through said third node when said first switch and said second switch are enabled, the direction and magnitude of said main current are determined by a first current and a second current, wherein said first current is outputted from said first current source and passes through said first switch, and said second current is outputted from said second current source and passes through said second switch, said calibration apparatus comprising:
- a detecting circuit coupled to said charge pump at said third node for outputting a detecting signal according to said direction and magnitude of said main current;
- a current adjusting circuit coupled to said detecting circuit for outputting a calibrating signal according to the polarity of the slew rate of said detecting signal, said current adjusting circuit comprising:
- a comparator for generating a comparison signal according to the polarity of the slew rate of said detecting current, wherein the comparison signal is a logic signal indicating whether the polarity of the slew rate of said detecting current is positive or negative, and said current adjusting circuit outputs said calibrating signal according to said comparison signal; and
- a calibrating circuit coupled to said charge pump and said current adjusting circuit for adjusting said first current and said second current according to said calibrating signal by outputting a first calibrating current and a second calibrating current to said charge pump.

7. A calibration apparatus according to claim 6, wherein said comparison signal is logic high if said polarity of said slew rate is positive; and said comparison signal is logic low if said polarity of said slew rate is negative.

8. A calibration apparatus according to claim 6, wherein said comparison signal is logic low if said polarity of said slew rate is positive, and said comparison signal is logic high if said polarity of said slew rate is negative.

9. A calibration apparatus according to claim 6,
wherein when said calibration apparatus enters a calibration mode to minimize said main current from said charge pump, both said first switch and said second switch are enabled;
wherein said current adjusting circuit is further for storing a signal corresponding to the slew rate of said detecting signal, and said current adjusting circuit determines whether to stay in the calibration mode according to a stored signal corresponding to the slew rate of said detecting signal so as to further decrease the main current.

10. A calibration apparatus according to claim 1, wherein said current adjusting circuit determines whether to stay in the calibration mode according to a stored signal corresponding to the slew rate of said detecting signal so as to further decrease the main current.

11. A calibration apparatus according to claim 5,
wherein when said calibration apparatus enters a calibration mode to minimize said main current from said charge pump, both said first switch and said second switch are enabled;
wherein said current adjusting circuit is further for storing a signal corresponding to the slew rate of said detecting signal, and said current adjusting circuit determines whether to stay in the calibration mode according to a stored signal corresponding to the slew rate of said detecting signal so as to further decrease the main current.

* * * * *